United States Patent [19]

Sato et al.

[11] Patent Number: 5,103,270
[45] Date of Patent: Apr. 7, 1992

[54] DOUBLE HETERO TYPE EPITAXIAL WAFER WITH REFRACTIVE INDICES

[75] Inventors: Tadashige Sato, Tsuchiura; Toshio Ishiwatari, Abiko; Hisanori Fujita, Ushiku, all of Japan

[73] Assignees: Mitsubishi Monsanto Chemical Company; Mitsubishi Kasei Corporation, both of Tokyo, Japan

[21] Appl. No.: 441,273

[22] Filed: Nov. 27, 1989

[30] Foreign Application Priority Data

Nov. 28, 1988 [JP] Japan .................................. 63-300228

[51] Int. Cl.⁵ .............................................. H01L 33/00
[52] U.S. Cl. .......................................... 357/17; 357/16; 372/45; 372/46; 372/43
[58] Field of Search ....................... 357/17, 16; 372/45, 372/46, 43, 44, 47

[56] References Cited

U.S. PATENT DOCUMENTS

| | | | |
|---|---|---|---|
| 4,426,702 | 1/1984 | Yamashita et al. | 357/17 X |
| 4,740,976 | 4/1988 | Kajimura et al. | 357/17 X |
| 4,902,356 | 2/1990 | Noguchi et al. | 357/17 X |
| 4,905,058 | 2/1990 | Yamada et al. | 357/17 |
| 4,935,935 | 6/1990 | Reed et al. | 357/17 X |
| 4,941,146 | 7/1990 | Kobayashi | 357/17 X |

Primary Examiner—William Mintel
Attorney, Agent, or Firm—Burgess, Ryan & Wayne

[57] ABSTRACT

A double hetero type epitaxial wafer contains a single crystal substrate, first and second conductivity type clad layers which are opposite and are made of mixed crystal compounds of Group III-V which had an indirect transition type band structure, and an active layer made of a mixed crystal compound of Group III-V which has a direct transition type band structure and is interposed between the respective clad layers, wherein the first conductivity type clad layer has a refractive index smaller than that of the second conductivity type clad layer.

7 Claims, 1 Drawing Sheet

DOUBLE HETERO TYPE EPITAXIAL WAFER WITH REFRACTIVE INDICES

BACKGROUND OF THE INVENTION

1. Field of the Invention

The present invention relates to a double hetero type epitaxial wafer, and more particularly, to a double hetero type epitaxial wafer suitable for producing a light emitting diode (LED) having a large light emission power output.

2. Description of the Related Art

In this specification, a compound consisting of a IIIb group element and a $V_b$ group element in the periodic table is referred to as a III-V group compound. A III-V group compound mixed crystal epitaxial wafer having a double hetero structure is suitable for producing an LED having a large power output, since it can confine carriers in an active layer and it has a low carrier loss due to a non-radiative recombination process.

Particularly, since by using an epitaxial wafer of a gallium aluminum arsenide (GaAlAs,) mixed crystal a red LED having a large power output can be produced, the epitaxial wafer is widely used for a display device or an automatic focus measuring device of a camera, etc.

The epitaxial wafer can be produced by an epitaxial growth of a required III-V group compound mixed crystal, which growth is carried out by a liquid phase epitaxial growth process, a chemical vapour epitaxial growth process, etc. on a single crystal substrate (hereinafter referred to as a substrate of gallium arsenide (GaAs), etc.) Nevertheless, since the GaAs, etc., used as a substrate has a low light penetration, light generated at a pn junction is absorbed by the substrate before being emitted to the outside. Conventionally, to prevent this light absorption by the substrate the substrate was cleaned by polishing or etching after the epitaxial growth.

Preferably, an epitaxial wafer has a thickness of at least 0.1 mm or more, to prevent a breakage of the wafer during the production of an LED. Therefore, the epitaxial layer is grown to a thickness of 0.1 mm or more.

When the thickness of the epitaxial layer is made thicker, however, a nonuniform mixed crystal composition is generated in an epitaxial layer particularly the clad layers, due to a difference of the segregation coefficient thereof.

SUMMARY OF THE INVENTION

An object of the present invention is to provide a III-V group compound epitaxial wafer suitable for the production of a high power output LED in which light is not absorbed by the substrate.

Accordingly there is provided a double hetero type epitaxial wafer comprising: a substrate; conductive and opposite conductive type clad layers respectively consisting of a III-V group compound mixed crystal having an indirect transition type band structure; and an active layer consisting of a III-V group compound mixed crystal having a direct transition type band structure intervened between said clad layers, wherein the refractive index of said single crystal substrate side clad layer is smaller than that of the other clad layer.

According to the present invention, gallium aluminum crystal arsenide (GaAlAs), crystal gallium indium phosphide (GaInP) crystal or gallium indium arsenide phosphide (GaInAsP) are preferably used as the III-V group compound mixed crystal.

These mixed crystals are suitable for producing a double hetero type epitaxial wafer, since by changing the mixed crystal ratio, a mixed crystal having an indirect transition type or direct transition type band structure can be obtained.

For example, in the case of a gallium aluminum arsenide crystal, at a mixed crystal ratio of about 0.45 or less the crystal has a direct transition type structure, and at a mixed crystal ratio of more than 0.45, the crystal has an indirect transition type structure.

DESCRIPTION OF THE PREFERRED EMBODIMENTS

Figure 1:
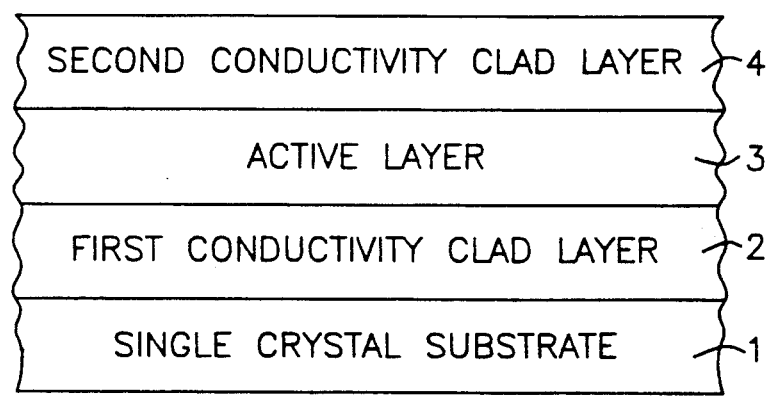
FIG. 1 is a side view of an embodiment of an epitaxial wafer in accordance with the invention.

According to the present invention, the phrase "mixed crystal ratio" means the ratio of respective elements of the Group III-V which form a compound composed of a mixed crystal. For example, gallium aluminum arsenide is represented by the formula $(GaAs)_{1-x}(AlAs)_x$, and the mixed crystal ratio of this crystal is represented by a molecular proportion (x) of the (AlAs) component.

Gallium indium phosphite is represented by the formula:

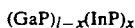

and the mixed crystal ratio of this crystal is referred to as a molar proportion x of the (InP) component.

Gallium indium arsenide phosphide is represented by the formula:

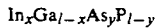

and the mixed crystal ratio of this crystal is referred to as a molar proportion x or y of the (In) or (As) component.

In the above formulae, the following relationship should be satisfied.

$$0 \leq x \leq 1, \text{ and } 0 \leq y \leq 1$$

The epitaxial wafer of the present invention is produced by an epitaxial growth of a desired III-V group compound mixed crystal on a substrate using a chemical vapor deposition (CVD)- or a liquid phase epitaxial growth process, or a molecular beam epitaxial growth process, etc. In the chemical vapor deposition growth process, for example, a metal organic CVD (MOCVD) process, a halid transportation process, etc. or a molecular beam epitaxial growth process, control of the composition and the thickness, etc., of the single crystal to be grown is easy, but on the other hand, since a single crystal layer having a larger thickness can be easily obtained in the liquid phase epitaxial growth process, the growth process is selected in accordance with the object of the epitaxial growth. GaAs, InP, etc. are preferable, as the substrate, but Si, Ge, etc. also may be used.

In the epitaxial wafer of the present invention as shown in FIG. 1, a first conductivity clad layer 2 is formed on a single crystal layer 1, an active layer 3 is formed on the first conductivity clad layer 2, and a second conductivity clad layer 4 is formed on the active layer 3. When the substrate 1 consists essentially of a p type single crystal, the first conductivity clad layer 2 and the active clad layer 3 respectively consists essentially of a p-type mixed crystal, and the second conductivity clad layer 4 consists essentially of a n-type mixed crystal. When the substrate 1 consists essentially of an n-type of single crystal, an n-type mixed crystal clad layer 2, an n-type mixed crystal active layer 3 and a p-type mixed crystal layer 4 are formed on the n-type single crystal substrate 1, in the above mentioned order.

When an epitaxial wafer containing a grown GaAlAs is grown, a p clad layer, an active layer, and an n clad layer are formed, in this order, on a p type GaAs substrate. Accordingly, when a p type GaAs substrate is used, since the difference between lattice constants of a p type GaAs and a GaAlAs is small, no generation of misfit dislocation is found, and since the p type carrier concentration of the GaAs substrate can be greatly increased, the electrode is easily formed.

According to the present invention a substrate side clad layer having a refractive index smaller than that of an upper side clad layer is used. Namely, a substrate side clad layer having a mixed crystal ratio larger than that of the upper side clad layer is used. Consequently, the light reflected at the interface between the substrate and the clad layer passes through the interface between the clad layer and the active layer, without an irregular reflection thereof, whereby the outer quantum efficiency of an LED is enhanced and the emission power of the LED is increased.

In the case of gallium aluminum arsenide mixed crystal epitaxial wafer, a substrate side p clad layer having a mixed crystal ratio larger by at least 0.02 than that of the upper side n clad layer is used.

In a III-V compound mixed crystal, the wider the band width, which is an energy gap between the valence band and a conductive band, the smaller the refractive index. For example, in a gallium aluminum arsenide, the larger the mixed crystal ratio, the larger the band width and the smaller the refractive index.

In the case of a gallium aluminum arsenide mixed crystal epitaxial wafer, ①, a layer thickness and ② mixed crystal ratio of each layer are preferably selected as follows.

(1) a p clad layer
① about 5 to about 40 μm, ② about 0.6 to about 0.9.
(2) an active layer
① about 0.5 to about 7 μm ② about 0 to about 0.45.
A p conductive type active layer is preferably selected. Accordingly wave length of output light changes from about 870 nm to 620 nm.
(3) an n clad layer
① about 5 to about 40 μm, ② about 0.5 to about 0.88.

Further, the carrier concentration of each layer having a usual range, for example, about $1 \times 10^{17}$ to $1 \times 10^{18}/cm^3$, is used. Preferably, the active layer has a larger carrier concentration than that of the p clad layer.

EXAMPLE

The following gallium aluminum arsenide mixed crystal epitaxial wafer for red LED was grown by a liquid phase epitaxial growth process.

(1) Substrate; The surface direction was (100). The substrate was a zinc doped p type gallium arsenide single crystal substrate having a thickness of 0.3 mm.

In the following example of the present invention and the comparative example, ① a layer thickness, ② a carrier concentration, and ③ a mixed crystal ratio are respectively described, in this order.

(2) a p clad layer (substrate side clad layer); ① 20 μm, ② $3.0 \times 10^{17}/cm^3$, ③ 0.81.
The refraction index of the p clad layer is about 3.15.
(3) an active layer; ① 2.0 μm, ② $5.2 \times 10^{17}/cm^3$, ③ 0.34.
(4) an n clad layer (upper side clad layer);
① 40 μm, ② $2.0 \times 10^{17}/cm^3$, ③ 0.72.
The refraction index of the n clad layer is about 3.19.

The carrier concentration was measured by a C-V process and a Van Der Pauw method. Further, the mixed crystal ratio was measured by obtaining a value measured by an x-ray microanalysis method, and correcting the value by a ZAF correction process.

LED chips having a square with a one side length of 0.3 mm and having a thickness of 0.25 mm were made from the obtained epitaxial wafer. After the obtained chips were coated with an epoxy resin, the various properties thereof were measured under a condition of a current density of 8 A/cm². The obtained LED light output was 1.8 cd (average value of 100 LEDs), the emission wavelength was 661 nm, and the forward voltage was 1.85V (average of 100 chips).

COMPARATIVE EXAMPLE

On a gallium arsenide single crystal similar to that used in the example of the present invention, the following gallium aluminum arsenide mixed crystal was grown by a liquid phase epitaxial growth process.

(1) a p clad layer; ① 18 μm, ② $3.5 \times 10^{17}/cm^3$, ③ 0.65
The refraction index of the p clad layer was about 3.21.
(2) an active layer; ① 1.8 μm, ② $5.2 \times 10^{m}/cm^3$, ③ 0.34.
(3) an n clad layer; ① 45 μm, ② $2.0 \times 10^{17} cm^3$, ③ 0.72
The refraction index of the n clad layer was about 3.18.

LED chips were made from the obtained epitaxial wafer in the same manner as used in the example of the present invention. The LED light output measured in the same manner as in the example of the present invention was 1.1 cd (average valve of 100 LEDs), and the peak light emission wavelength was 663 nm.

According to the present invention, a strong light output can be obtained without removing the substrate. Further, since it is not necessary to grow a large and thick epitaxial layer to remove a substrate, the nonuniformity of the composition of the epitaxial layer is not generated.

We claim:
1. A double hetero type epitaxial wafer comprising:
a single crystal substrate;
a first conductivity type clad layer and a second conductivity type clad layer arranged on the substrate int he above-mentioned order and respectively consisting essentially of a mixed crystal compound of Group III-V having an indirect transition type band structure, the conductivity of the second conductivity clad layer being opposite to that of the first conductivity clad layer; and
an active layer consisting essentially of a mixed crystal compound of Group III-V having a direct tran- sition type band structure and interposed between the first and second conductivity type clad layers, said first conductivity type clad layer having a refractive index smaller than that of the second conductivity type clad layer.

2. The double hetero type epitaxial wafer according to claim 1 wherein said mixed crystal compound of Group III-V is selected from the group consisting of gallium aluminum arsenide, gallium indium phosphide and gallium indium arsenide phosphide mixed crystals.

3. The double hetero type epitaxial wafer according to claim 1 wherein said single crystal substrate consists essentially of p-type gallium arsenide, the first conductivity type clad layer consisting essentially of p-type mixed crystal, and the second conductivity type clad layer consisting essentially of n-type mixed crystal.

4. The double hetero type epitaxial wafer according to claim 3, wherein the p-type first conductivity clad layer has a thickness of from about 5 to about 50 $\mu$m and a mixed crystal ratio of from about 0.6 to 0.9.

5. The double hetero type epitaxial wafer according to claim 3, wherein the n-type second conductivity clad layer has a thickness of from about 5 to about 50 $\mu$m and a mixed crystal ratio of from about 0.5 to 0.88.

6. The double hetero type epitaxial wafer according to claim 1, wherein said active layer consists essentially of p-type mixed crystal.

7. The double hetero type epitaxial wafer according to claim 6, wherein the active layer has a thickness of form about 0.5 to 7 $\mu$m and a mixed crystal ratio of less than about 0.45.

* * * * *